United States Patent [19]
Loh et al.

[11] Patent Number: 5,172,382
[45] Date of Patent: Dec. 15, 1992

[54] ULTRAHIGH FREQUENCY OPTICAL SELF-MODULATOR

[75] Inventors: Wei-Hung Loh, Ithaca; Alfred T. Schremer, Freeville; Yukihiro Ozeki; Chung L. Tang, both of Ithaca, all of N.Y.

[73] Assignee: Cornell Research Foundation, Inc., Ithaca, N.Y.

[21] Appl. No.: 651,008

[22] Filed: Feb. 5, 1991

[51] Int. Cl.⁵ .............................................. H01S 3/10
[52] U.S. Cl. ...................................... 372/26; 372/25; 372/27; 372/94; 372/106
[58] Field of Search ................. 372/26, 27, 25, 94, 372/105, 106

[56] References Cited

U.S. PATENT DOCUMENTS

| | | | |
|---|---|---|---|
| 3,356,438 | 12/1967 | Macek et al. | 350/150 |
| 3,420,600 | 1/1969 | Mevers et al. | 350/150 |
| 3,593,188 | 7/1971 | Nussmeier | 372/26 |
| 3,766,393 | 10/1973 | Herzog et al. | 250/199 |
| 3,900,247 | 8/1975 | Zaky | 359/247 |
| 3,956,626 | 5/1976 | Ross | 359/184 |
| 4,071,751 | 1/1978 | Waksberg | 250/201 |
| 4,221,463 | 9/1980 | Barsack et al. | 350/150 |
| 4,528,668 | 7/1985 | Wayne et al. | 372/26 |
| 4,637,026 | 1/1987 | Liu | 372/22 |
| 4,709,368 | 11/1987 | Fukuda et al. | 372/10 |
| 4,930,131 | 5/1990 | Size, II | 372/26 |

Primary Examiner—James W. Davie
Attorney, Agent, or Firm—Jones, Tullar & Cooper

[57] ABSTRACT

Polarization self-modulation of a laser produces high-frequency optical modulation without the use of high-speed electronics. This is accomplished by inserting into a laser cavity a polarization converter, which rotates the polarization of the laser light periodically as the light passes through the converter as it circulates in the cavity. The frequency of the modulation is determined by the cavity length. In one configuration, a quarter-wave retardation plate is used as the intracavity polarization converter in a Fabry-Perot laser. In a second embodiment, the converter is an electro-optic crystal which acts as an electronically-controllable half-wave retardation plate.

18 Claims, 8 Drawing Sheets

FIG. 7c 2 nsec ⊢—⊣

ULTRAHIGH FREQUENCY OPTICAL SELF-MODULATOR

This invention was made with Government support under Grant No. EET-88-15833, awarded by the National Science Foundation. The Government has certain rights in the invention.

BACKGROUND OF THE INVENTION

The present invention relates, in general, to apparatus for ultrahigh frequency modulation of light, and more particularly, to a self-modulated laser which generates ultrahigh frequency optical modulation through polarization of the laser beam as it circulates in the laser cavity.

Semiconductor lasers are attractive sources of high frequency optical pulses, because of their small size and ease operation. The usual techniques for reliably generating such pulses have included gain switching and active mode locking; however, such direct modulation of these lasers is inadequate for achieving ultra-high frequency modulation because the modulation rate will be fundamentally limited by the relaxation oscillation frequency $f_{ro}$ of the lasers. Most efforts to extend the frequency response of such optical modulation focus on optimizing the laser parameters which would enhance $f_{ro}$, and although such endeavors may yield incremental improvements, less conventional techniques are needed to provide truly improved results that would enable such devices to produce optical pulses having a repetition rate in the range of 100 GHz.

SUMMARY OF THE INVENTION

It is an object of the present invention to provide optical pulses at ultrahigh repetition rates.

It is a further object of the invention to provide optical pulses with repetition rates in excess of several hundred MHz without the use of high speed electronic circuitry.

It is a further object of the invention to provide ultrahigh frequency optical pulses through the use of polarization self modulation of a laser.

Briefly, the present invention is directed to a polarization self-modulated laser for generating high-frequency optical modulation. This is accomplished by inserting a polarization converter into a laser cavity so that the converter rotates the polarization of the light periodically as it circulates in the cavity. This rotation of the polarization produces modulation of the light intensity when the light passes through a polarizer, with the frequency, or repetition rate, of the modulation being determined by the cavity length. In one embodiment of the invention, a Fabry-Perot laser configuration, utilizing a semiconductor laser diode as the lasing medium, incorporates a quarter-wave retardation plate. This plate converts transverse electric (TE) polarization to transverse magnetic (TM) polarization, and vice-versa, to change the polarization of the light circulating in the cavity. In a second embodiment, an electro-optic waveplate (EOW) is inserted in a ring cavity and acts as an electronically controllable half-wave retardation plate. Precise control of the retardation is available by the application of a controllable d.c. bias voltage across the waveplate to allow changes in the frequency of modulation. Large changes in the voltage applied across the EOW (on the order of 500 V) extinguish the modulation to provide a simple on-off switching operation.

In the first embodiment, an external cavity is established between a semiconductor laser diode and a mirror. A quarter-wave plate is located between the laser diode and the mirror, and the diode is energized. With the laser biased just above threshold, a continuous wave (cw) output is obtained; however, a small increase in the bias leads to pulsing output. The TE and TM portions of the pulsed light output, which may be observed by corresponding photodiodes through a polarization beam splitter, have a 180° phase shift with respect to each other, while the pulse period is twice the external cavity round trip time. Either the TE or the TM component can be used to produce output pulsations with a 50% duty cycle. Since the quarter wave plate performs the polarization switching operation, this technique is capable of very high speed operation with very short external cavities.

In the second embodiment, an external ring cavity is established, for example, by three 45° incidence mirrors and a beam splitter which serves as an output coupler. A semiconductor laser diode is positioned in the cavity, as is a longitudinal electro-optic waveplate (EOW). The waveplate may be a Z-cut KDP crystal with the Z axis parallel to the direction of propagation of light in the cavity, and with its fast and slow axes being at 45° to the TE and TM directions. When the EOW is energized by a voltage, for example, when $V_{EOW} \approx V_\pi$, or about 6 kV, the EOW acts as a zero-order half-wave retardation plate, and polarization self modulation is produced in the cavity As a result, an oscillation between TE and TM modes is produced, with the period of oscillation being proportional to the length of the cavity. Small adjustments to mirror alignment or to $V_{EOW}$ results in higher frequency polarization modulation. Again, large changes in $V_{EOW}$, on the order of 500 V, extinguish the modulation to provide on-off switching.

Higher frequency modulation is obtained by shortening the external cavity, so a cavity about 250 μm long will produce a modulation frequency in the range of 100 GHz. As an alternative to such a short cavity, additional wavefront partitions can be provided in the cavity by introducing an additional partial reflector, such as a glass slide, at an appropriate distance from the diode. The reflections produced at the surfaces of the slide create favorable conditions for two counter-rotating modes to reinforce each other.

BRIEF DESCRIPTION OF THE DRAWINGS

The foregoing, and additional objects, features and advantages of the present invention will be more clearly understood by those of skill in the art from the following detailed description of preferred embodiments, taken in conjunction with the accompanying drawings, in which.

DETAILED DESCRIPTION OF THE PREFERRED EMBODIMENT

Figure 1:
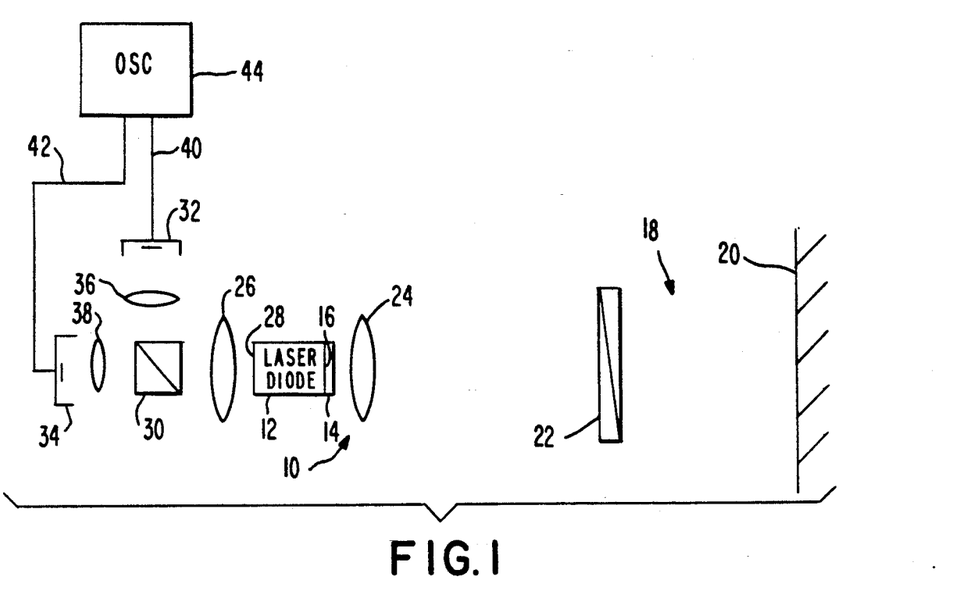
FIG. 1 is a diagrammatic illustration of a polarization self-modulated laser in accordance with the present invention.

Turning now to a more detailed consideration of the present invention, there is illustrated in FIG. 1 a polarization self-modulation laser generally indicated at 10 which includes a semiconductor laser diode 12 having an antireflection coating 14 of a few percent on its front facet 16. In one embodiment of the invention, diode 12 is a 1.3 micrometer wavelength laser with a V-grooved inner stripe on a P substrate, making up a VIPS structure approximately 700 micrometers long. The diode 12 is biased in conventional manner (not shown) and an external cavity 18 is formed between the diode and a reflecting mirror 20. Interposed in the cavity between the end 16 of diode 12 and the mirror 20 is a quarter-wave plate (QWP) 22, which may be a multiple order plate. A lens 24 is interposed between the diode 12 and QWP 22 to focus light from the laser into cavity 18, while a second lens 26 is provided at the opposite end of the diode to direct output light from a second end facet 28 of diode 12 through a polarizing beam splitter 30. The beam splitter divides the output light from diode 12 into its transverse electric (TE) and its transverse magnetic (TM) polarizations. These polarized components of the laser light are directed to a pair of corresponding avalanche photodiodes 32 and 34 through corresponding lenses 36 and 38, with the outputs of the photodiodes being directed by way of lines 40 and 42, respectively, to an oscilloscope or other recording device 44. The polarizer 30, the photodiodes 32 and 34 and the oscilloscope 44 permit separate observation of the TE and the TM components of the light produced by diode 12.

Figure 2:
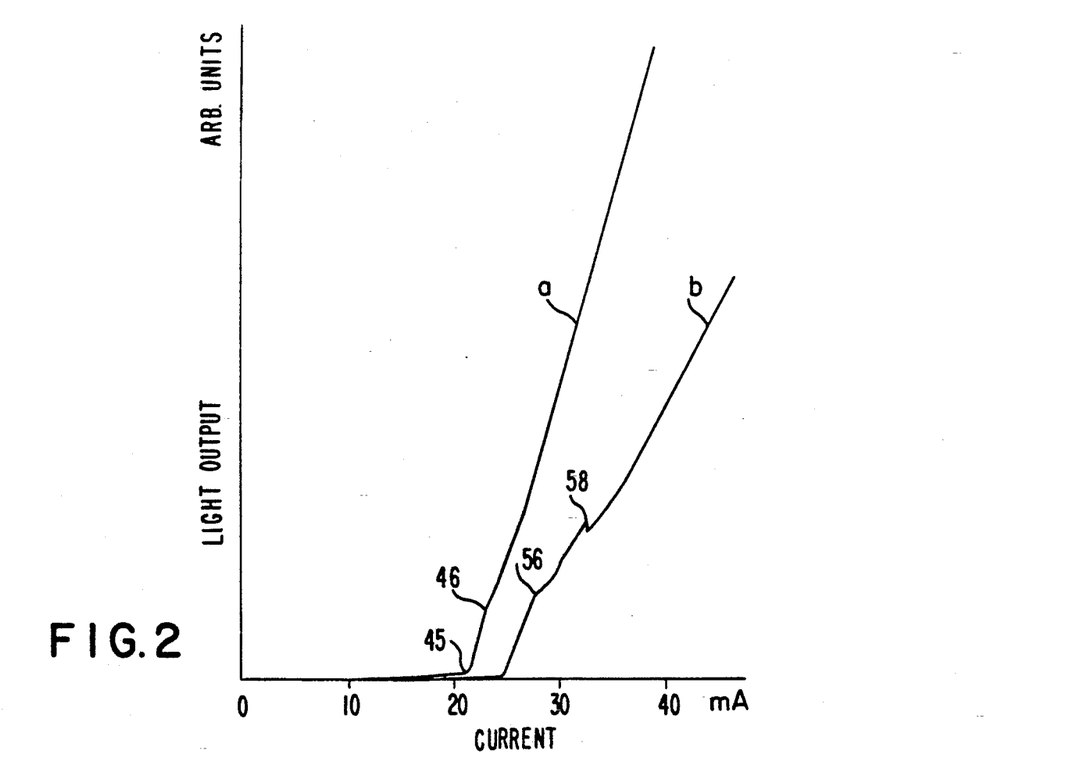
FIG. 2 is a graphical illustration of the laser light output versus laser current characteristics for a mirror feedback and for a grating feedback of the device of FIG. 1.

The laser diode 12, when operating alone under DC bias has a light emission threshold at about 37 mA. However, with the external cavity configuration illustrated in FIG. 1, this threshold drops to 21.5 mA. The relationship between the light output from diode 12 and the current supplied to the diode by a DC bias circuit in the cavity configuration of FIG. 1 is illustrated in FIG. 2 at curve a, showing the effect of QWP 22. As there illustrated at threshold 45 a low light output is obtained, indicating the onset of lasing. In the device of FIG. 1, however, a kink 46 appears in curve a at a current slightly above the threshold, the kink 46 corresponding to the onset of pulsations in the light output. No such kink or bend appears in the light versus current characteristic of a solitary laser, nor does such a kink appear in the usual external cavity configuration in the absence of the retardation plate 22. With the diode biased above threshold, but below the location of kink 46, the light output from the diode is continuous wave and includes both TE and TM components. With the bias increased above the kink 46 in curve a, stable pulsations are observed, as illustrated in the oscilloscope traces 50 and 52 illustrated in FIG. 3. In the traces of this illustration, the DC bias was 27 ma (or 1.3 times threshold) with the cavity length between the front facet 16 of the laser diode and the surface of mirror 20 being 100 cm.

In operation, the application of a bias to the laser diode causes the diode to produce output light which is directed into the external cavity 18. The principle axes of the QWP 22 are at 45° with respect to the TE and TM polarizations so that the quarter wave plate 22 changes the polarization state of the light from TE to TM, and vice versa, each time the light makes a round trip from the diode 12, through plate 22 to the mirror 20 and back through plate 22 to the diode. The light re-enters the laser diode after every round trip in the external cavity so that the light emerging from the back facet 28 of the laser is predominantly TE for every other external cavity round trip and is predominantly TM for the remaining external cavity round trips, the TE and TM portions of the light exhibiting a 180° phase shift with respect to each other. Intensity modulation of light, in accordance with the present invention, results from pulsations produced by separating the TE and the TM components with a polarizer such as the polarizing beam splitter 30. These pulsations are detected separately by the detectors 32 and 34, and displayed on oscilloscope 44, as illustrated in FIG. 3, and selection of one or the other of the TE or TM components provides a pulse-modulated output light at a wavelength determined by the diode and at a pulse repetition rate determined by factors such as the length of cavity 18, as will be described.

Figure 3:
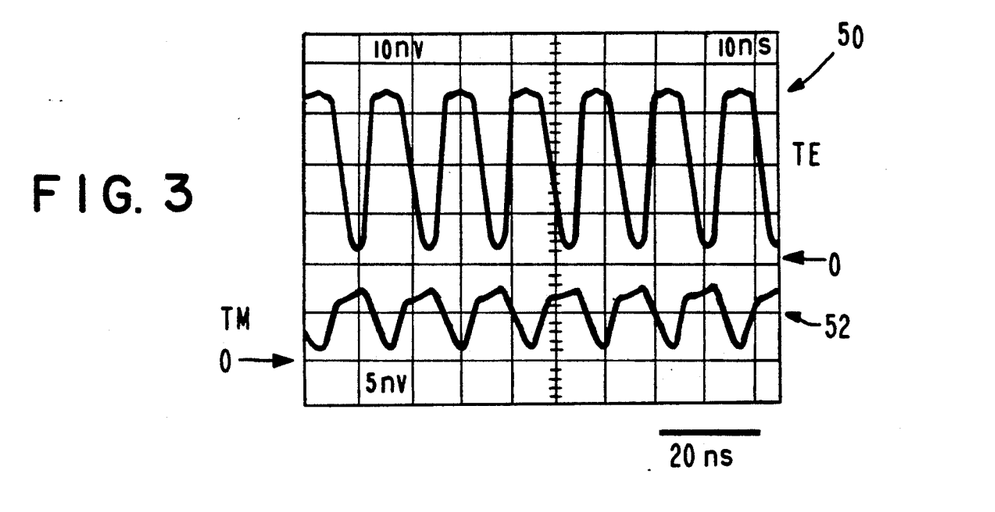
FIG. 3 is an oscilloscope trace of optical pulses produced by the of FIG. 1.

Although the oscilloscope traces 50 and 52 in FIG. 3 show the intensity of the TE light (trace 50) as approximately six times larger than that of the TM light (trace 52), this is due to the optics of the particular system used to obtain experimental data and due to the differences in the two detectors 32 and 34. In the experiment which produced the traces of FIG. 3, one of the detectors was a germanium avalanche photodiode and the other one was InGaAs photodiode. In reality, the TM pulses have about one-half the amplitude of the TE pulses.

Figure 4:
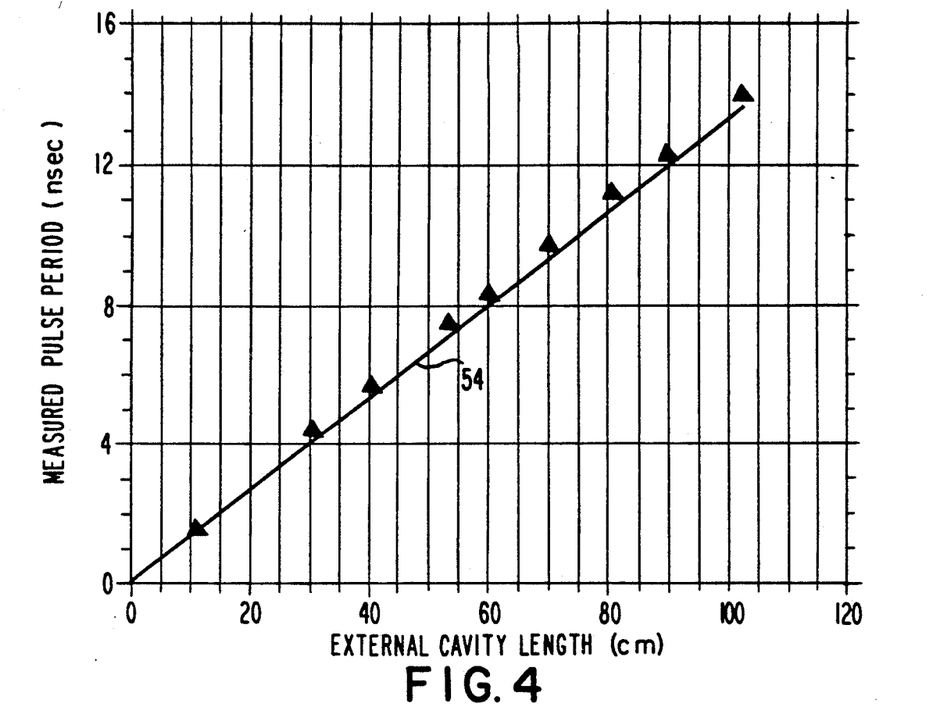
FIG. 4 is a graphical illustration of the measured optical pulse period as a function of cavity length for the device of FIG. 1.

FIG. 4 illustrates the relationship between the pulse period, or repetition rate, of the device of FIG. 1 and the cavity length. As indicated by line 54 in FIG. 4, there is a linear relationship between these parameters for cavity lengths from 11.5 cm to 100 cm. The pulse rate at the short cavity length corresponds to a repetition frequency of 620 MHz, while the pulse rate at the longest cavity length corresponds to a repetition frequency of 75 MHz, as may be seen in the graph of FIG. 4. In an experimental test of the present invention, it was found that the frequency of the pulses in the shortest cavity length was beyond the bandwidth of the oscilloscope being used, and thus was measured by an RF spectrum analyzer.

Since the quarter-wave plate 22 is used to perform the polarization switching operation, and since the gain in the laser diode does not change much with changes in polarization, the present technique is potentially capable of very high rate of polarization switching, on the order of greater than several GHz, through the use of very short external cavities, on the order of less than a few centimeters. This can be accomplished without requiring high speed electronics. The gain in the diode does not change if its gain and the mirror losses are polarization independent, but if they are dependent on polarization, there can be some change in laser gain. It is noted that the quarter-wave plate is not an obstacle to monolithic integration, since it can be replaced by a semiconductor waveguide TE to TM converter.

When the bias current applied to the diode is increased, it is found that at some point the output light pulses no longer return to the zero light level, but instead begin to ride on a minimum DC level. This appears to be due to the sensitivity of the multiple order waveplate 22 to the wavelength of the incident light, and to the broad spectrum of the laser. To eliminate these complications, a diffraction grating may replace the flat mirror 20 in the external cavity. The light output versus current characteristic of this configuration is shown in FIG. 2 at curve b. This curve shows two distinct kinks, 56 and 58, the first kink 56 corresponding to the onset of stable pulsations as previously described with respect to kink 46 in curve a. The threshold 56 for the onset of pulsations is higher in the system exemplified by curve b primarily because, in the experimental setup for testing the present invention, the grating used was not blazed at the laser wavelength, and thus had a lower feedback coupling than did the mirror 20. With the grating, it was found, through the use of a monochromator having a resolution of less than 1 Angstrom, that the lasing spectrum was confined to a single diode mode which remained fixed as the bias current was changed.

Figure 5A:
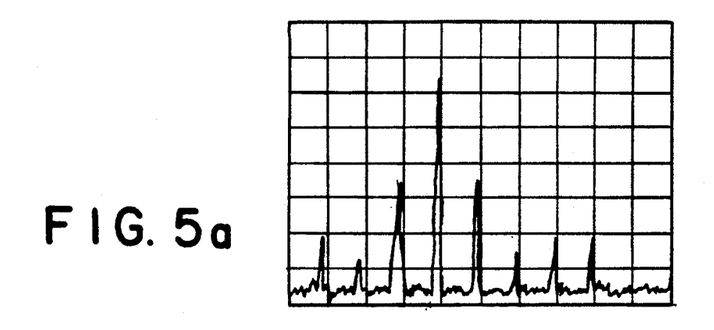
FIGS. 5a–5d are RF spectrum analyzer traces of the output of the device of FIG. 1, with increasing bias.
Figure 5B:
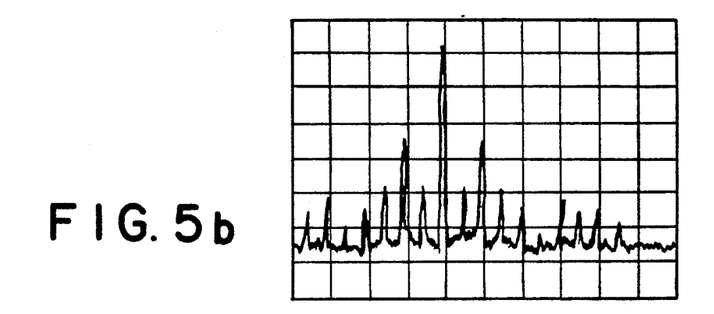
Figure 5C:
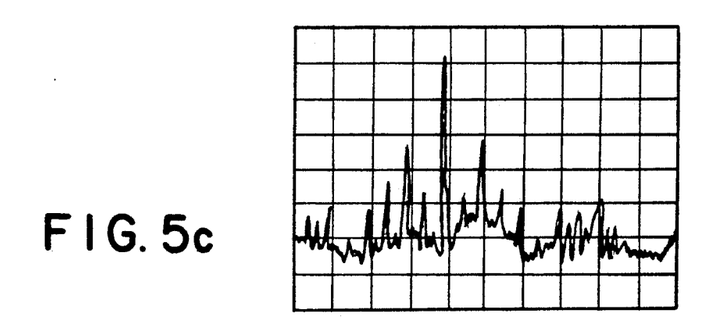
Figure 5D:
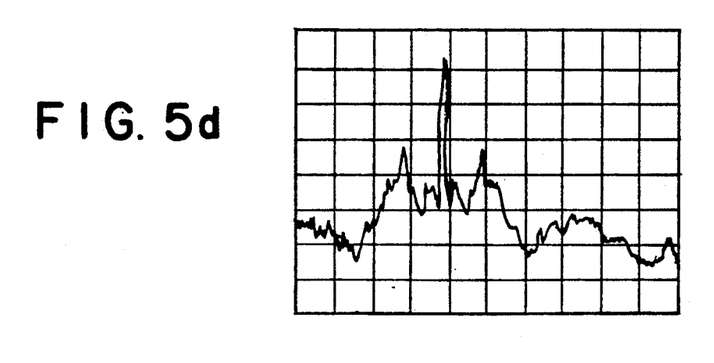

Using the grating, it was possible to hold the minima of the optical pulses close to the zero light level, with only the amplitudes of the pulses increasing with the bias current. As the bias current was further increased, another instability was observed, corresponding to the second kink 58 in the light versus current curve b. In this region it was found that, as the current was increased, it became increasingly difficult to obtain a stable trace on the oscilloscope. Accordingly, the signal from one of the photodiodes (the one monitoring the TE component) was sent to an RF spectrum analyzer instead of to an oscilloscope. The results, as illustrated in FIGS. 5a through 5d, reveal that the RF spectrum undergoes a series of period doublings with increasing bias before broadening considerably. FIG. 5a shows the output spectrum with a bias of 29.2 ma, providing stable pulses at 90 MHz. FIG. 5b shows the spectrum with a bias of 29.7 ma which produces a doubling of the pulse rate. FIG. 5c shows the spectrum analysis with a bias of 30.1 ma, while FIG. 5d shows the spectrum with a bias of 31 ma. As seen in FIGS. 5c and 5d, the increasing bias results in a chaotic pulse repetition, with the chaos being due primarily to a polarization instability. By slight adjustments of the grating, it has been found that in addition to the doubling of the pulse period, a tripling of the period can also be achieved before the onset of chaos.

At a bias level below the onset of chaos, the output consists of a small modulation on top of a DC level, the modulation being due to the difference in amplitudes between the TE and TM pulses. As chaos is approached, the modulation becomes unstable and the DC level due to the sum of the TE and TM modes is largely unaffected. The onset of chaos provides a useful tool for the study of this phenomenon in semiconductor lasers.

The foregoing polarization self-modulation technique is based on a linear optical effect that is inherently essentially lossless, and is capable of operation in the range of 100 GHz in a monolithically integrated circuit. Thus, polarization self modulation is capable of operation at very high speeds and is not limited by the inherent relaxation oscillation frequency of the laser, as discussed above. A further example of this operation is illustrated in the external-cavity hybrid ring semiconductor laser generally indicated at 60 in FIG. 6. As illustrated, the ring laser consists of three 45° incidence mirrors 62, 63 and 64 as well as a beam-splitter 65 forming the four corners of a closed ring cavity generally indicated at 66. The beam splitter serves as the output coupler for both clockwise and counterclockwise optical signals propagating in the cavity 66. A laser diode 68 is mounted in the path of the ring cavity and may be a conventional GaAlAs BH structure having anti-reflection coatings 70 and 72 on its end facets 74 and 76, respectively. A pair of lenses 78 and 80 are located adjacent the ends of the diode and direct light from the diode into the external cavity, and vice versa, as is well known.

Figure 6:
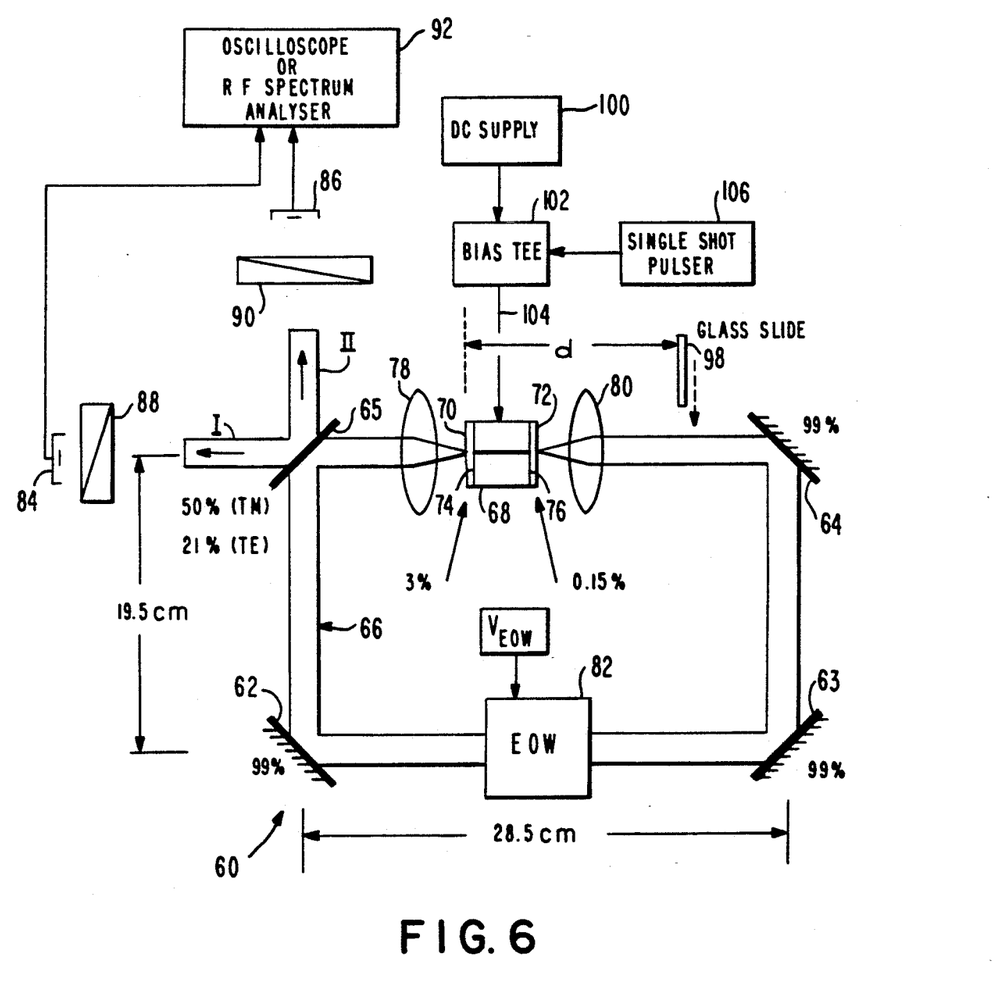
FIG. 6 is a diagrammatic illustration of a second embodiment of the polarization self-modulated laser of the present invention.

A longitudinal electro-optic half-wave waveplate (EOW) 82 is located in the external cavity 66 in the path of light propagating therein. The EOW is a Z-cut KDP crystal with the Z axis oriented parallel to the direction of propagation of the light in the cavity. The fast and slow axes of the EOW 82 are at 45° to the TE and TM directions. A bias voltage 83 is applied across the EOW 82 and when that voltage $V_{EOW}$ is approximately equal to $V_\pi$, or about 6 KV, the EOW acts as a zero-order, halfwave retardation plate. The retardation can be precisely controlled by the voltage applied, and this precise control is very useful for investigating the behavior of the laser in a reproducible way. The half wave voltage could also be shifted from $V_\pi$, to zero volts with the addition of a bias plate, or by slightly tilting the KDP crystal 82, if desired.

The threshold of the laser diode 68, when it is uncoated and not included in an external cavity, is about 6.5 ma. When it is located in the ring cavity 66 of FIG. 6 with $V_{EOW}$ equal to zero, with an anti-reflection coating on its end facets, the threshold of the diode 68 is 10 ma and the output light produced by the laser is linearly TE-polarized. TM polarized oscillation is achieved by inserting a polarization converter such as EOW 82 in the cavity, in which case the threshold becomes 12.5 ma. With $V_{EOW}$ equal to $V_\pi$, the threshold is about 13 ma, with light polarized in both TE and TM. Polarization self-modulation starts spontaneously when $V_{EOW}$ is approximately equal to $V_\pi$ and the laser bias exceeds 18 ma. The output power for the light produced by the device of FIG. 6 is about 3 mw per arm at 2×Ith.

When the light from the diode 68 travels in the cavity 66 and passes through the half wave (λ/2) EOW 82, the polarization is rotated 90°. When the light is focused back into the laser diode 68 by the cavity and by the lenses 78 and 80, stimulated emission sustains lasing in this new polarization. During the next round trip of light propagating in the ring cavity, the light is converted back into the original polarization. Hence, the light alternately flips between the TE and the TM modes, with an oscillation period of c/2L, where L is the cavity length. This explanation applies to both the counterclockwise propagating light indicated by I in FIG. 6 and to the counterclockwise light propagating in the cavity and indicated by II. In one embodiment of the invention, the cavity length was about 9.6 cm, and polarization self-modulation was observed.

In an experiment constructed to test the operability of the ring laser of the present invention, polarization self-modulation was observed in both of the output arms I and II of the ring cavity. This observation was made by means of two high-speed P-I-N detectors 84 and 86 which included polarizers 88 and 90, respectively, placed between the detectors and the beam splitter output mirror 65. The polarizers 88 and 90 permit selection of either the TE or TM polarizations for measurement by the respective detectors. The light output from the polarization self-modulation laser cavity 60, when viewed through the TE polarization, was found to be an approximate square wave with a frequency of 150 MHz (equal to c/2L). When viewed in the TM polarization, a similar waveform was observed, only phase shifted by 180°.

It was found that with small adjustments to the mirror alignment or to the voltage $V_{EOW}$, higher frequency polarization modulation could be obtained. Large changes to $V_{EOW}$, on the order of 500 volts, extinguishes the modulation and thereby provides a simple means for electro-optically switching the modulation on and off. The higher frequency waveforms are similar in character to the fundamental frequency oscillations; that is, the TE and the TM oscillations are 180° out of phase, etc.. However, it was observed that the frequencies obtained were always odd multiples of the fundamental; i.e., $f=nf_0$, where $f_0=150$ MHz and where n is an odd integer. Waveforms up to $n=7$ (representing 1.15 GHz) were obtained in this way.

Figure 7A:
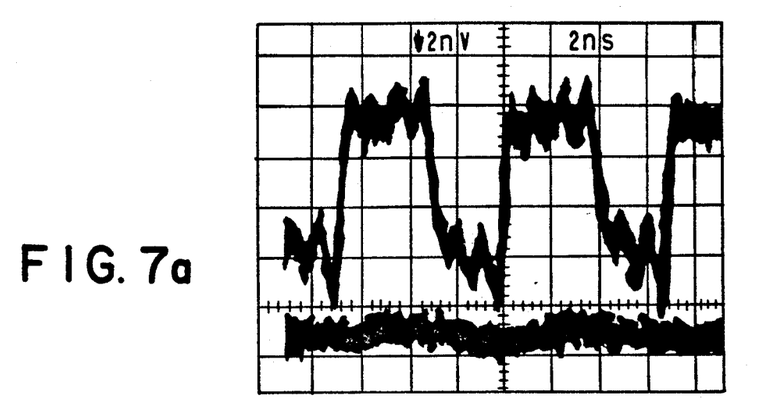
FIGS. 7a-7c are oscilloscope traces of optical pulses produced by the device of FIG. 6 with varying electro-optic waveplate voltages.
Figure 7B:
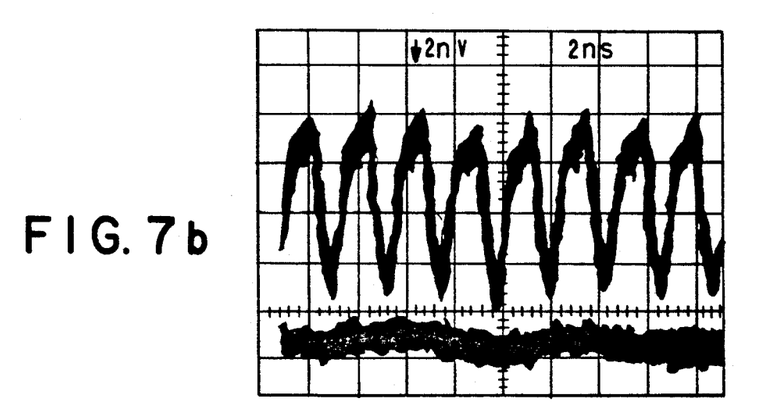
Figure 7C:
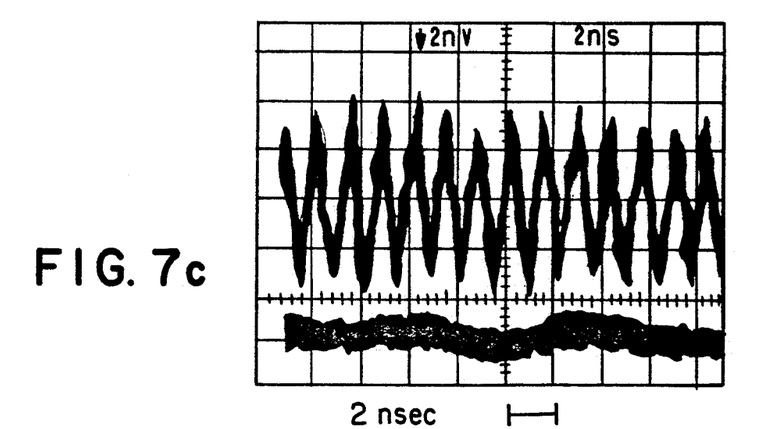

FIGS. 7a through 7c are illustrations of oscilloscope outputs representing polarization self-modulation obtained at (a) $f_0$ equal to about 150 MHz; (b) at $3f_0$ and (c) at $5f_0$ by varying the voltage $V_{EOW}$. The oscilloscope 92 displays show the signals viewed through a TE polarizer, such as the polarizer 90 in FIG. 6. Similar waveforms could be observed in the TM polarization, but with a phase shift of 180°. In FIGS. 7a through 7c, no mechanical cavity adjustments were made; only the voltage $V_{EOW}$ was changed, with 6.5 KV being applied for FIG. 7a, 6.3 KV for FIG. 7b, and 5.9 KV for FIG. 7c, with a laser bias of 2×Ith. Although FIGS. 7a, b and c show waveforms for the fundamental and for multiples of three and five, respectively, waveforms up to 7 times the fundamental frequency (1.15 GHz) have been obtained through variations in the EOW voltage. The waveforms of FIGS. 7a through 7c show zero-light baselines at the bottoms of the graphs and the top of each waveform illustrates a "ringing" phenomenon.

Figure 8A:
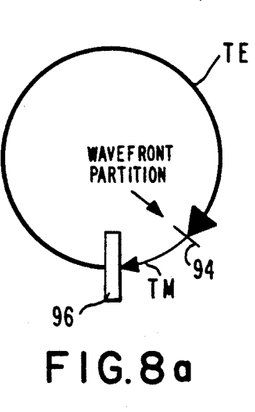
FIGS. 8a-8c are graphical representations of the operation of device of FIG. 6, illustrating the boundaries separating TE polarization light from TM polarization light in the cavity of the laser of FIG. 6.
Figure 8B:
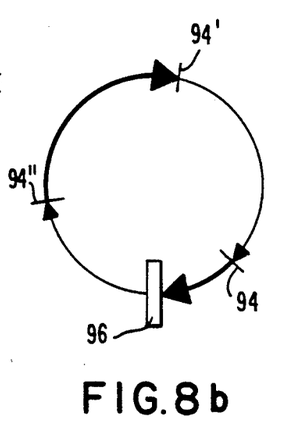
Figure 8C:
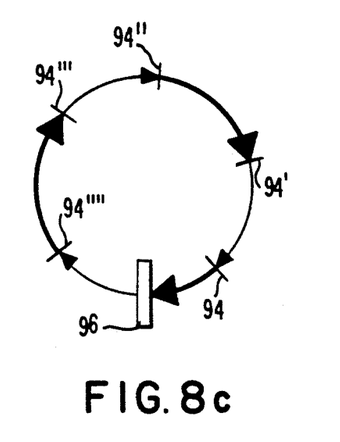

The possibility of obtaining modulation frequencies in addition to the fundamental frequency by mechanical modification is illustrated by the idealized ring cavity configurations of FIGS. 8a through 8c, where for clarity only the clockwise propagating mode is illustrated. FIG. 8a illustrates the situation for the fundamental frequency where the circulating light has a single wavefront partition 94 separating the TE component from the TM component. The polarization of the wave only changes when it crosses a polarization converter such as a wave plate 96. The thick and thin sections of the circle refer to circulating waves of orthogonal polarizations which shift from TE to TM or vice-versa. It is possible, as illustrated in FIGS. 8b and 8c, to partition the light into more sections; for example, three sections as shown in FIG. 8b and five sections as shown in FIG. 8c, by the inclusion of additional converter elements, to be described. The TE and the TM outputs for these two additional situations observed at any fixed point in the cavity as the light propagates around it would show modulation frequencies three and five times the fundamental, respectively. As illustrated in FIGS. 8a through 8c, self consistency around the closed ring requires that the number of wave front partitions be odd. Experimentally it has been found that the light is usually divided into TE and TM sections of roughly equal length. Under certain conditions, it can be partitioned into sections that differ significantly in length.

Figure 9A:
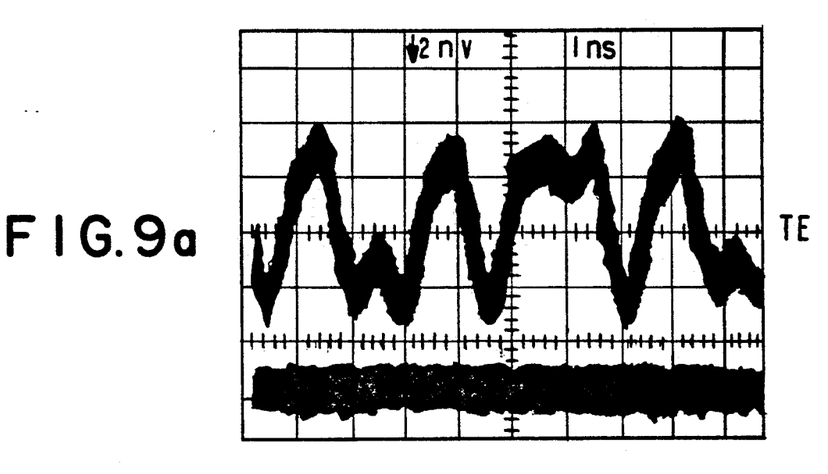
FIGS 9a and 9b are oscilloscope traces of optical self polarization modulation waveforms from the device of FIG. 6, showing unequal TE/TM sections.
Figure 9B:
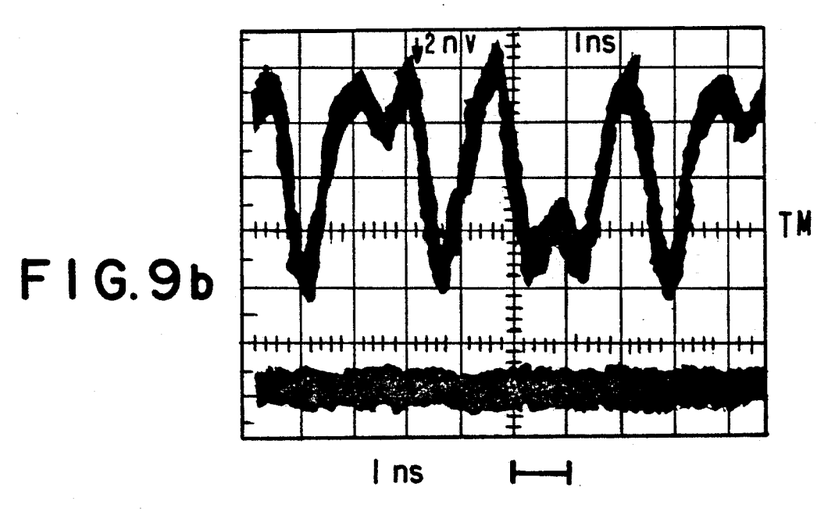

In FIG. 9, self polarization modulation waveforms are illustrated, showing unequal TE/TM components as seen through a TE polarizer for FIG. 9a and through a TM polarizer for FIG. 9b.

Although the partitioning illustrated in FIG. 8 can produce higher frequency modulation, the most straightforward approach to obtaining such higher frequencies is by shortening the cavity. For practical applications, the preferred configuration would be the monolithic integration of the ring laser with a TE to TM converter which has a half wave voltage of about 20 volts. Such a device approximately 250 micrometers long would operate at about 100 GHz. Furthermore, such oscillation could be switched on or off or controlled through the application of a voltage to the integrated electro-optic TE-TM converter. However, a short cavity is not essential to the achievement of higher frequency oscillation if a reliable way can be found to create the desired number of wave front partitions.

In accordance with the present invention, additional wave front partitions can be achieved in a ring laser by introducing a passive partial reflector such as an uncoated glass slide, illustrated at 98 in FIG. 6. The glass slide is, for example, 100 micrometers thick, is uncoated, and is placed a distance d from one facet of the laser diode, in this case the facet 74. This facet has a 3% reflectivity, and the reflections at both the glass slide and the 3% reflectivity facet create favorable conditions for the two counter-propagating modes to reinforce each other when the TE and the TM components have lengths which are equal to d. Thus, when L/d equals n, where L is the length of the cavity, d is the distance between the diode facet and the glass slide, and n is an odd integer, the light in the ring cavity will be divided into TE and TM sections of length d separated by n wave front partitions. In this way, strong polarization self modulation is achieved to GHz frequencies.

Figure 10:
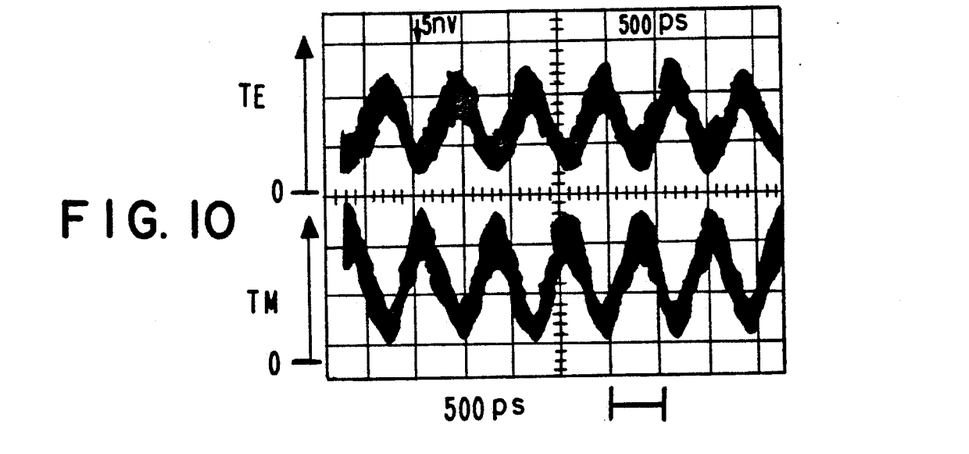
FIG. 10 is an oscilloscope trace of optical pulses produced by the device of FIG. 6, with the addition of a partial reflector in the laser cavity.
Figure 11:
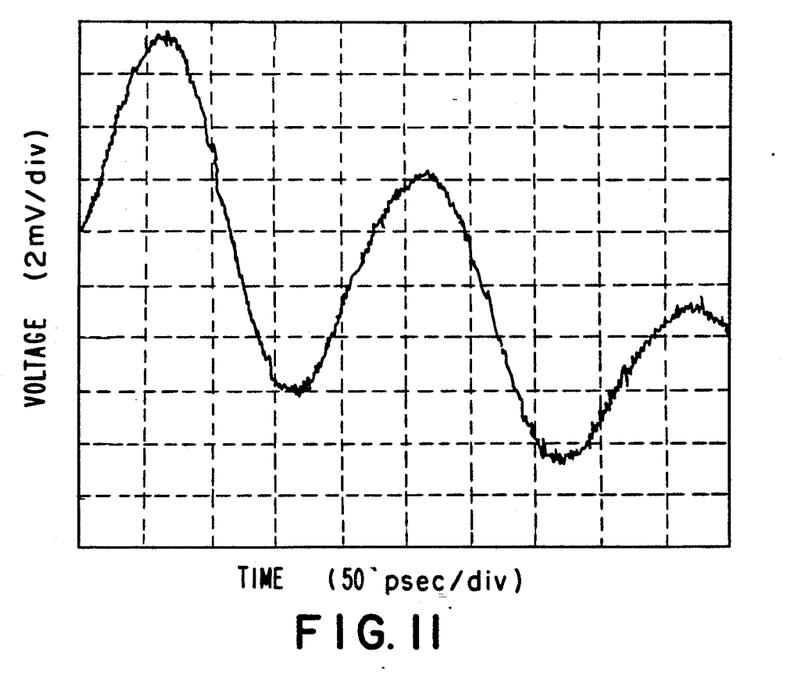
FIG. 11 is a graphical illustration of the output of the device of FIG. 10 at a modulation rate of 4.95 GHz.

FIG. 10 shows an oscilloscope trace of the modulation obtained at $n=9$ (1.35 GHz), where $d=11$ cm. At 2 times $I_{th}$ the relaxation frequency is basically given by the inverse of the geometric mean of the population relaxation time and the cavity life time, which for this laser are approximately 1 and 3 ns, respectively. Thus, $f_{r0}$ is less than several hundred MHz, and modulation at n greater than or equal to 9 clearly exceeds $f_{r0}$. For even higher values of n, a Hypers PSC-1000 superconducting scope was used to see substantial modulation even at 5 GHz (FIG. 11). In the graph of FIG. 11, the distance d was equal to 2.5 cm and the measured modulation depth was about 20 percent, but might be significantly larger since the display was affected by factors such as detector response, electrical loss in cables, etc. For example, as the frequencies reach 6 GHz, the measurable modulation diminishes significantly due to detector roll off. In addition, at such frequencies, the waveforms are seen to be riding upon a lower frequency modulation, for the rf spectrum of the signal shows extra peaks around 1 GHz, probably due to additional undesired reflections in the cavity which can upset the modulation frequency selectivity.

Figure 12A:
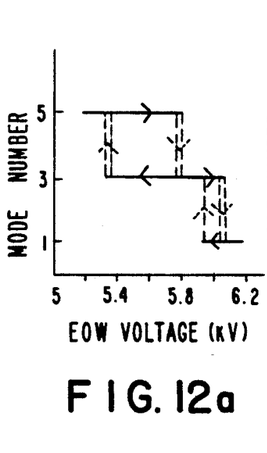
FIGS. 12a-12c are graphical illustrations of typical hysteresis loops obtained by varying the voltage across the electro-optic waveplate of FIG. 6.
Figure 12B:
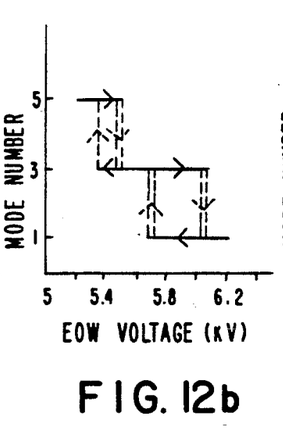
Figure 12C:
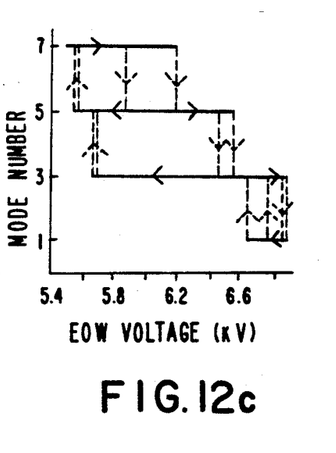

As indicated above, the various polarization modes can be selected by either varying the EOW voltage or by adjusting the cavity mirrors slightly. It has been found that when the modes are switched by changing the EOW voltage, hysteresis behavior occurs. In addition, the hysteresis loops so produced can be modified by minor mirror adjustments. FIGS. 12a through 12c show three typical sets of hysteresis loops which differ from each other by having slight adjustments made to the mirrors. The data was taken by sending the detected light signals to an RF spectrum analyzer at 92 in FIG. 6 and observing the spectrum as the EOW voltage is varied. As the transition voltages are reached, the spectrum changes abruptly. The voltage was scanned twice for each set and variations in the transition voltages in the two scans are displayed as dotted lines. As illustrated in FIGS. 12a and 12b, the transition voltages are quite reproducible, within 20 to 30 volts, as can be seen by simply scanning the EOW voltage back and forth within one hysteresis loop. FIG. 12c illustrates a tristable condition which produces more variation in the transition voltages.

As illustrated in FIG. 6, the bias voltage applied to the diode 68 for production of lasing action is supplied by a DC supply source 100 through a bias tee 102 and by way of line 104 to the diode. It has been found that mode switching can be induced in the laser 60 by applying momentary current pulses to the diode laser while the EOW voltage is within a hysteresis loop value. Current pulses from a single shot pulser 106 may be supplied to the diode 68 by way of the bias tee 102 and line 104, with the pulser 106 being configured so that single current pulses can be delivered; for example, by manually depressing a switch. The pulses have a polarity opposite to the DC bias and have a 1 nanosec duration. This is shorter than the cavity round trip time of 3.3 n sec, so that the laser is perturbed but is not completely turned off. Pulse amplitudes of at least a volt (producing approximately 20 ma in the laser) were effective in causing mode switching. In particular, it was found that by decreasing the EOW voltage to a value at the edge of a hysteresis loop, an applied pulse will cause the lower order mode to switch to the higher order one virtually all the time. Resetting the laser to the lower order mode is then most reliably accomplished by blocking the cavity briefly, as by the insertion of a mechanical shutter into the ring cavity. In situations where tristability exists, such current pulses may cause the laser to switch among the three allowed modes, although in a seemingly random manner. The variation in the EOW voltage changes the retardation slightly from half wave.

Although the present invention has been described in terms of preferred embodiments thereof, it will be apparent to those of skill in the art that numerous variations and modifications may be made without departing from the true spirit and scope thereof as set forth in the accompanying claims:

What is claimed is:

1. A self-modulated polarization laser comprising:
   a semiconductor laser diode means generating laser light having TE and TM modes;
   an external cavity receiving said light from said laser diode means and returning the light to said laser diode means;
   wave partition means in said external cavity for shifting said TE and TM modes of said laser light to corresponding TM and TE modes, respectively;
   output means emitting light having said shifted TE and TM modes from said cavity; and
   polarizing means responsive to said emitted light to produce pulses varying in intensity with said changes in mode to thereby produce a pulsed light output having a predetermined repetition rate.

2. The device of claim 1, wherein said external cavity has a length which determines the fundamental repetition rate of said pulsed light output.

3. The device of claim 2, wherein said external cavity is a linear cavity having said laser diode means at one end and reflecting means at the opposite end.

4. The device of claim 3, wherein said wave partition means is a quarter wave plate.

5. The device of claim 2, wherein said external cavity is a ring cavity, and wherein said output means includes at least one partially transmissive means.

6. The device of claim 5, wherein said wave partition means includes a half-wave plate.

7. The device of claim 6, wherein said half-wave plate is an electro-optic waveplate.

8. The device of claim 7, wherein said waveplate is variable to vary the repetition rate of said output pulses.

9. The device of claim 7 wherein said waveplate is electrically variable, and wherein said partition means further includes variable voltage means for varying said waveplate to vary the repetition rate of said output pulses.

10. The device of claim 9, wherein said partition means further includes passive partial reflector means in said cavity.

11. The device of claim 5, wherein said output means includes beam splitter means for selecting one of said TE and TM modes.

12. The device of claim 5, wherein said laser diode includes bias means for energizing said diode to produce said laser light.

13. The device of claim 12, further including pulse means connected to said diode for inducing mode switching in said diode.

14. The device of claim 12, wherein said wave partition means includes an electro-optic waveplate and a passive partially transmissive reflector means in said cavity, said waveplate producing output light pulses at a fundamental repetition rate, and said passive reflector means producing output light pulses at an odd multiple of said fundamental frequency.

15. The device of claim 1, wherein said external cavity is a linear cavity having said laser diode means at one end and reflecting means at the opposite end, said wave partition means being a quarter wave plate interposed between said diode and said reflecting means whereby light emitted from said diode, reflected from said reflecting means, and returned to said diode is shifted by one-half wave.

16. The device of claim 15, wherein said output means includes said diode means.

17. The device of claim 15, wherein said external cavity has a length which determines the fundamental repetition rate of said pulsed light output.

18. A self-modulated polarization laser, comprising:

laser means generating light having TE and TM modes;

an external cavity receiving said light from said laser means and directing said light along a return path to said laser means;

polarizing means in said external cavity interposed in the path of said light to change the polarization of said TE and Tm modes to TM and TE modes, respectively, whereby the polarization of each of said TM and TE modes returned to said laser means is phase shifted;

means directing said returned light to separating means for separating said TM and TE modes, said returned light containing predominantly said TE mode for alternate cavity round trips of laser generated light and containing predominantly said TM mode for remaining cavity round trips of laser generated light, said separated TM and TE modes comprising intensity modulated light pulses having a wavelength determined by said laser means and having a pulse repetition rate dependent on the length of said path in said external cavity.

* * * * *